United States Patent [19]

Scarra

[11] Patent Number: 5,467,358
[45] Date of Patent: Nov. 14, 1995

[54] PROCESS FOR CHECKING THE MEMORIES OF A PROGRAMMED MICROCOMPUTER BY MEANS OF A MICRO-PROGRAM INCORPORATED IN THE MICROCOMPUTER ITSELF

[75] Inventor: Flavio Scarra, Milan, Italy

[73] Assignee: SGS-Thomson Microelectronics, s.r.l., Milan, Italy

[21] Appl. No.: 943,186

[22] Filed: Sep. 10, 1992

[30] Foreign Application Priority Data

Sep. 10, 1991 [IT] Italy .................. 91A002385

[51] Int. Cl.$^6$ .................................. H04B 17/00
[52] U.S. Cl. .............. 371/22.3; 371/21.1; 371/21.2; 395/375
[58] Field of Search .................. 371/22.3, 21.1, 371/21.2, 16.1; 395/575; 364/DIG. 1; 326/95–98, 37–50; 327/202

[56] References Cited

U.S. PATENT DOCUMENTS

| 4,744,049 | 5/1988 | Kuban et al. | 364/900 |
| 5,130,568 | 7/1992 | Miller et al. | 371/22.3 |
| 5,153,882 | 10/1992 | Lyon et al. | 371/21.1 |
| 5,224,101 | 6/1993 | Popyack, Jr. | 371/21.1 |
| 5,226,149 | 7/1993 | Yoshida et al. | 364/DIG. 1 |

FOREIGN PATENT DOCUMENTS

| 0315275A2 | 5/1989 | European Pat. Off. | G06F 15/06 |
| 57-176600 | 10/1982 | Japan | G11C 29/00 |
| 59-119595 | 7/1984 | Japan | G11C 29/00 |

OTHER PUBLICATIONS

Gollakota et al., "Testing of the 1486 Microprocessor," Nov. 1990, pp. 175–178.

Primary Examiner—Ellis B. Ramirez
Assistant Examiner—Hal D. Wachsman
Attorney, Agent, or Firm—David V. Carlson; Robert Iannucci; Seed and Berry

[57] ABSTRACT

A process for checking, reading or writing memories of a programmed computer. The process selects a pre-selected logic space in a memory to be checked. The process triggers the addressing micro-instructions of a suitable micro-program related to a pre-selected checking procedure, so as to cause its execution by means of a pre-established number of clock strokes. The micro-instructions of the micro-program are executed according to an incremental sequence and repeated in a loop.

28 Claims, 1 Drawing Sheet

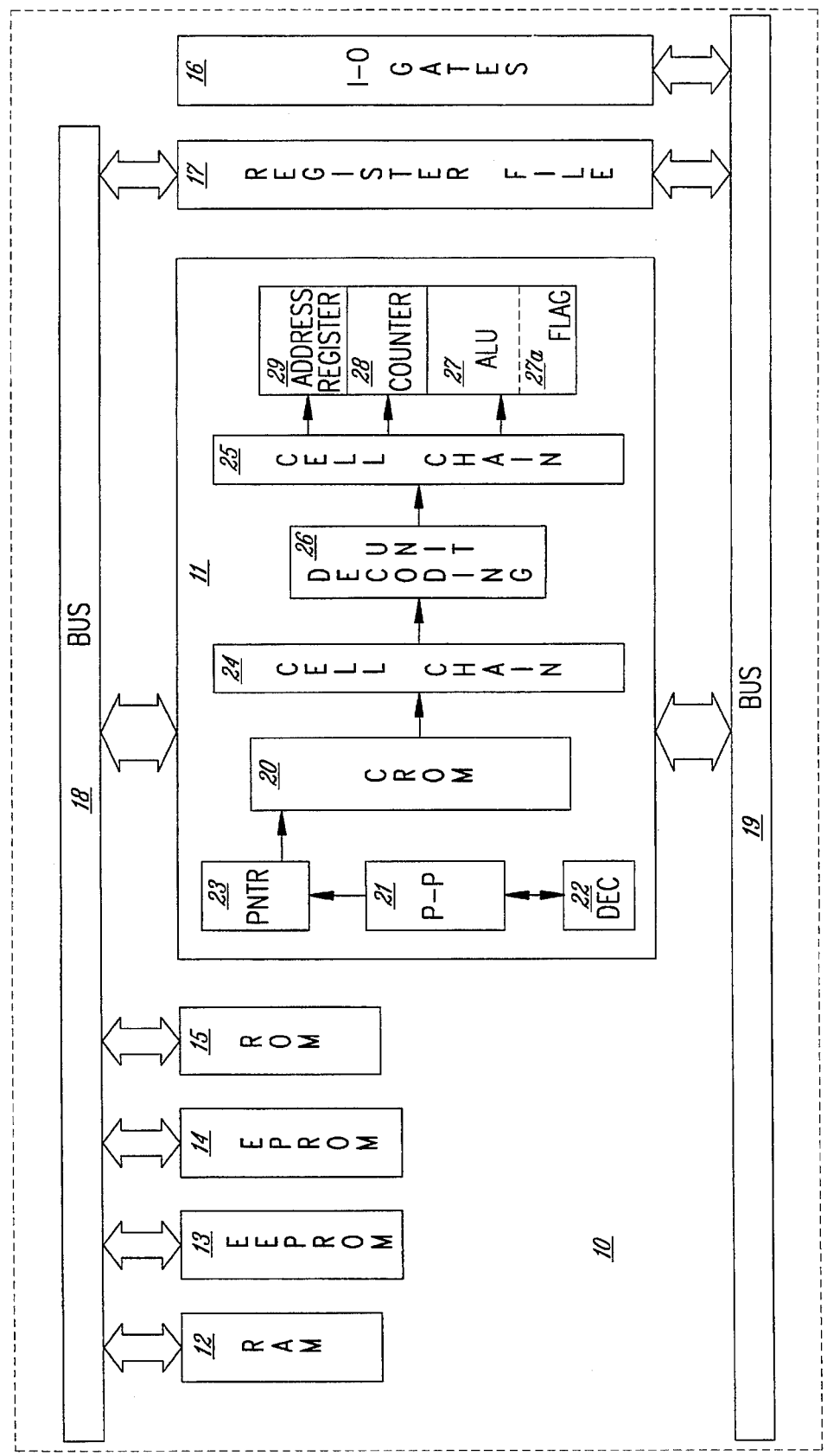

PROCESS FOR CHECKING THE MEMORIES OF A PROGRAMMED MICROCOMPUTER BY MEANS OF A MICRO-PROGRAM INCORPORATED IN THE MICROCOMPUTER ITSELF

TECHNICAL FIELD

The present invention relates to a process for checking the memories of a programmed microcomputer, optimized as regards life and efficiency.

BACKGROUND OF THE INVENTION

In the production of microcomputers the finished products are subjected to testing operations, in order to check on their functionality.

Generally microcomputers have memories within them of not inconsiderable size, and the checking time depends on the size of the memory. The checking time also depends on the type of memory to be checked, and a minimum of three readings is required for a ROM (READ ONLY MEMORY) and a maximum of sixteen readings for an EPROM (ERASABLE READ ONLY MEMORY). It can be seen that checking operations involve problems of time and cost, especially because they are executed on very expensive machines.

With the current checking devices and procedures, based on programs formed by instructions, that require a discrete time for the process of reading any information contained in the memory, testing times are very long and involve substantial increases in production costs.

SUMMARY OF THE INVENTION

An object of the present invention is a process for checking the memories of a microcomputer, that allows an improvement in the analysis of said memories, at the same time minimizing checking times, so as to reduce production costs.

According to this object a process has been developed for checking the memories of a programmed microcomputer, including:

read only memories and read-and-write memories (ROM, EPROM, EEPROM, RAM), mapped into logic spaces suitable for containing information related to programs and data;

a group of input and output ports;

a register file;

a central microprocessor unit (CPU) comprising in turn:

a control memory suitable for containing micro-programs constituted by micro-instructions;

a pre-processor suitable for addressing the input points of the micro—by means of decoded instructions;

a decoder circuit for decoding said addresses of the input points of the micro-program;

a pointer capable of addressing said micro-instructions of said micro-programs;

two scanning cell chains (latches) suitable for being triggered by means of pre-established operating signals and capable of providing control signals of said logic spaces of said memories and said micro-programs;

a decoding unit capable of transforming into operational signals said micro-instructions of the micro-programs contained in said control memory;

an arithmetic-logic unit (ALU) containing an indicator register (flag);

a program counter and an incrementer, capable of controlling the process of addressing the information contained in said read-only and read-and-write memories;

a circuit for the process of addressing, capable of providing the address of each register of said register file and each of said input and output ports;

the above process being characterized in that it comprises the following steps:

to trigger said scanning cell chains by means of pre-established operating signals to generate control signals indicative of the pre-selected logic space of one of said memories to be checked, according to a pre-selected checking procedure that can be executed by means of micro-instructions of a suitable micro-program stored in said control memory;

to select, through said scanning cell chains, said logic space where the memory access will be performed;

to initialize, through said scanning cell chains, said program counter, to define the starting point of said pre-selected memory to be checked;

to select, through said scanning cell chains, one of said ports as an output port, on which to send all information taken from said pre-selected memory;

to trigger, through said scanning cell chains, said control memory, said pre-processor, said decoding unit and said pointer, the process of addressing said micro-instructions of the micro-program related to said checking procedure, in order that it be executed by means of a pre-established number of clock strokes according to the size of the memory to be checked;

to send to said output gate information taken from said pre-selected memory;

to repeat in a loop, according to an incremental sequence, the execution of said micro-instructions of the micro-program so as to send in succession to said output port all the information contained in the same pre-selected memory;

to reset the micro-controller through a special signal to return it to normal operating conditions.

According to a preferred embodiment, said micro-program suitable for executing a pre-selected checking procedure is a micro-program formed by groups of micro-instructions for executing a procedure for reading said memories.

According to another preferred embodiment, said micro-program suitable for executing a pre-selected checking procedure is a micro-program formed by groups of micro-instructions to execute a process of writing during the testing step, of said memories.

With the checking process according to the invention, based on micro-program and on an infinite loop micro-procedure, it is possible to proceed to an incremental reading, or writing, of the memories of a micro-controller, analyzing all the information contained in them., in a very short time.

The process according to the invention is particularly advantageous because it is based on micro-programs incorporated into the microcomputer and of a general-purpose type, that may be used on any microcomputer of the same family without any changes and with no specific adaptations.

BRIEF DESCRIPTION OF THE DRAWINGS

FIG. 1 illustrates, with a block diagram, a micro-processor that incorporates micro-programs suitable for executing the checking process according to the invention.

DETAILED DESCRIPTION OF THE INVENTION

FIG. 1 shows a micro-controller 10 including a central micro-processor unit (CPU) 11 a reading and writing memory (RAM) 12, an electrically-erasable programmable read-only memory (EEPROM) 13, an erasable programmable read-only memory (EPROM) 14, a read-only memory (ROM) 15, a group of input and output ports 16, a register file 17, a bus 18 operationally connected to the memories 12–15 and to the central micro-processor unit 11, and a bus 19 operationally connected to the same central micro-processor unit, to the group of input and output ports 16 and to the register file 17.

The central micro-processor unit 11 in turn comprises a read-only control memory (CROM) 20, a pre-processor 21, a decoding circuit 22, a pointer 23, two scanning cell chains 24 and 25, a decoding unit 26, an arithmetic logic unit (ALU) 27 containing an indicator register (flag) 27a and two data registers 27b and 27c (AD and AB), a program counter and incrementer 28, an address circuit 29 for the process of addressing the registers of the file 17 and the I-O ports 16, all connected operationally together.

The control memory 20 is suitable for containing micro-programs formed by micro-instructions suitable for executing the checking procedures, such as the process of reading of memories 12–15, and the process of writing during the testing step of memories 12–14.

The pre-processor 21 contains the instructions register and the logic that overcome the decision of which kind of processes have to be executed (a next input point or the sequential evolution of the micro-program) and provide to the pointer 23 the corresponding address of said micro-programs. The decoding circuit 22 executes the decoding of instructions generating the input points of the same micro-programs. The pointer 23 is capable of addressing said micro-instructions of said micro-programs.

The two scanning cell chains (latches) 24 and 25 are suitable for being triggered by means of pre-established operating signals, that are introduced into the micro-processor 11 through a reset port of the group 16, and are capable of supplying all control signals of the micro-controller 10, and particularly said read-only and read-and-write memories.

The decoding unit 26 is capable of transforming into operational signals said micro-instructions of the micro-programs contained in the control memory 20.

The arithmetic-logic unit 27 contains two data registers 27b and 27c (AD and AB) and an indicator register (flag) 27a suitable for identifying the logic space where the memory reading and writing will be performed according to the logic space mapping of the memories 12–15.

The program counter and incrementer 28 is capable of controlling the process of addressing the information contained in said read-only and read-and-write memories.

As has already been said, the control memory 20 contains micro-programs suitable for executing procedures for checking, reading from or writing to the memories.

The micro-program for executing the procedure for reading is formed by the following sequence of micro-instructions:

a first micro-instruction suitable for starting the reading operation with an address previously latched in an address master latch: u1) START READ (next u2);

a second micro-instruction to prepare the process of addressing the subsequent information to be read, in a buffer register (master latch) of the selected memory: u2) INC+→ PC & LIP, R* (next u3);

a third micro-instruction suitable for writing information read from the addressed memory to a pre-selected register that corresponds to an I-O port of the group 16, and to recharge the counter and incrementer 28 with the address of the subsequent information to be read: u3) MEM→DWR PC→INC SET INC (next u1).

The micro-program for executing the procedure for writing information identical with pre-selected addresses is formed by the following sequence of micro-instructions:

a first micro-instruction suitable for starting the operation of writing, with an address previously latched in an address master latch, an information identical with the low part of an address: u1) START WRITE PC1→LIP, RO (next u2);

a second micro-instruction suitable to prepare the process of addressing the subsequent information to be written, in a buffer register of the selected memory: u2) INC+→PC & LIP, R* (next u3);

a third micro-instruction suitable for recharging the incrementer 28 with the address of the subsequent information to be written: PC→INC SET INC (next u1).

The micro-program for executing the matrix-type writing procedure of information identical with that contained in two ALU registers (AD and AB), is formed by the following sequence of micro-instructions:

a first micro-instruction suitable for starting the operation of writing, with an address previously latched in an address master latch, an information identical with that contained in the first register (AD): u1) START WRITE AD→LIP, RO (next u2);

a second micro-instruction suitable to prepare the process of addressing the subsequent information to be written, in a buffer register of the selected memory: u2) INC+→PC & LIP, R* (next u3);

a third micro-instruction suitable for recharging the incrementer 28 with the address of the subsequent information to be written: PC→INC SET INC (next u4);

a fourth micro-instruction suitable for starting the operation of writing, with the address previously latched in the address master latch, information identical with that contained in the second register (AB): u4) START WRITE AB→LIP, RO (next u5);

a fifth micro-instruction to prepare the process of addressing the subsequent information to be written, in a buffer register of the selected memory: u5) INC+→PC & LIP, R* (next u6);

a sixth micro-instruction suitable for recharging the incrementer 28 with the address of the subsequent information to be written: PC→INC SET INC (next u1).

To execute the process of checking the memories 12–15, by means of the reading procedure or by means of the reading and writing procedure, pre-established operating signals are introduced through a reset gate of the group 16. These operating signals that, for example, consist of two pre-selected voltage levels, 7.5 volts and 5 volts, sent in a given sequence, generate control signals that interrupt the normal operation of the micro-controller and trigger the scanning cell chains 24 and 25. Any one of many known scanning cell chains can be used for the scanning cells of 24 and 25. One acceptable type of scanning cell chains, with a "scan path" procedure is described in the Italian patent application No. 21820 A/90, and is described in U.S. patent application Ser. No. 07/781,360, in the name of the same Applicant, which has issued as U.S. Pat. No. 5,225,724. These scanning cells 24 and 25 select the logic space of one of the memories 12–15 to be checked that contain either program information or data information. The same scanning cell chains select the starting point of the memory to be tested, set the incrementer 28 with the information identifying the same starting point, set the master latch of the selected memory with the starting point information and select one of the I-O ports of the group 16. Selecting one port means that every time a writing operation will be performed in the Register space the corresponding register is the I-O ports selected. This means that the scanning cell chains configure in to the Address Register 29 the physical address of the port. The scanning cell chains configure the port selected as the output of the information taken from the selected logic space, so that the information is transferred into the pre-selected register that corresponds to the I-O port.

When executing a matrix-type writing procedure, the scanning cell chains define in the two ALU registers (AB and AD) the data for writing to the memory.

The same scanning cell chains 24 and 25 trigger the address of the input point of one of the micro-programs for checking, reading or writing, stored in the control memory 20. The address of the input point is triggered through the pointer 23.

Control of the reading and writing micro-programs is executed through the number of clock strokes necessary for the entire operation to be completed. Each set of micro-instructions of the same micro-program requires one clock stroke and three clock strokes are necessary for reading a piece of information, while from three to six clock strokes are necessary for writing a piece of information.

The checking process is executed with an infinite-loop micro-procedure, which in the minimum access time of three clock strokes for internal memories, executes an incremental reading, or writing, with the information returned on the selected output gate of the group 16.

To exit from the checking procedure the micro-controller 10 is reset.

The checking process described, based on micro-programs and on an infinite-loop micro-procedure, allows the execution of the reading and writing process of the memories of a micro-controller, in a complete manner, analyzing all the information contained in them, with a substantial time saving over the usual procedures, based on programs formed by instructions that, for the process of reading information contained in the memory, typically require ten clock strokes.

Another advantage of the proposed procedure is that of being based on micro-programs incorporated in the microcomputer and of the general-purpose type, that may be used on any microcomputer without any changes and with no specific adaptations.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A process for checking memories of a programmed microcomputer, the microcomputer including: read-only memories and read-and-write memories mapped into logic spaces suitable for containing information related to programs and data; a group of input and output ports; a register file; and a central microprocessing unit, the microprocessing unit including a control memory suitable for containing a micro-program constituted by micro-instructions; a pre-processor suitable for providing addresses of input points of the micro-program by means of decoded instructions; a decoder circuit for decoding said addresses or the input points of the micro-program; a pointer capable of addressing said micro-instructions of said micro-program; two scanning cell chains suitable for being triggered by means of pre-established operating signals and suitable for providing control signals of said logic spaces of said memories and of said micro-program; a decoding unit that transforms into operational signals said micro-instructions of the micro-program contained in said control memory; an arithmetic-logic unit containing an indicator register; a program counter and incrementer suitable for controlling addressing the information contained in said read-only and read-and-write memories; and an addressing circuit capable of providing an address of each register of said register file and of said input and output ports, the process comprising the steps of:

triggering said scanning cell chains by means of pre-established operating signals to generate control signals indicative of a pre-selected logic space of a pre-selected one of said memories to be checked, according to a pre-selected checking procedure that can be executed by means of said micro-instructions of said micro-program stored in said control memory;

selecting through said scanning cell chains, said pre-selected logic space where memory access will be performed;

initializing, through said scanning cell chains, said program counter, to define the staging point of said pre-selected memory to be checked;

selecting through said scanning cell chains one of said ports, as an output, on which to send all information taken from said pre-selected memory;

triggering, through said scanning cell chains, said control memory, said pre-processor, said decoding unit and said pointer, the addressing of said micro-instructions of the micro-program related to said pre-selected checking procedure, in order that it be executed by means of a pre-established number of clock strokes according to the size of the memory to be checked;

sending to said output information taken from said pre-selected memory;

repeating in a loop, according to an incremental sequence, the executing of said micro-instructions of the micro-program so as to send in succession to said output all the information contained in the same pre-selected memory, thereby checking the pre-selected memory; and resetting said microprocessing unit through a special signal to return it to normal operating conditions.

2. The process according to claim 1 wherein said pre-selected checking procedure within said triggering said scanning cell chains includes:

executing a procedure for reading said memories.

3. The process according to claim 2 wherein said step of executing the procedure for reading includes:

starting the procedure for reading using an address previously latched in an address master latch;

preparing for addressing subsequent information to be read from a buffer register of the pre-selected memory; and writing information read from the addressed memory to the selected port of said group, and recharging said program counter and incrementer with an address of the subsequent information to be read.

4. The process according to claim 1 wherein said pre-selected checking procedure within said triggering said scanning cell chains includes:

executing a process of writing of pre-established information in said memories.

5. The process according to claim 4 wherein said step of executing the process for writing includes:

starting writing information identical with a low-order part of an address into a storage location of the pre-selected memory, the storage location being indexed by an address previously latched in an address master latch;

preparing for addressing subsequent information to be written to a buffer register of the pre-selected memory; and recharging said program counter and incrementer with an address of the subsequent information to be written.

6. The process according to claim 4 wherein said step of executing the writing process includes:

starting writing information identical with information contained in a first of two pre-selected registers into a first storage location of said pre-selected memory indexed by a first address previously latched in an address master latch;

preparing for addressing subsequent information to be written to a buffer register of the pre-selected memory;

recharging said program counter and incrementer with an address of the subsequent information to be written;

starting writing information identical with information contained in a second of the pre-selected registers into a second storage location of said pre-selected memory indexed by a second address previously latched in the address master latch;

preparing for addressing subsequent information to be written to a buffer register of the pre-selected memory; and recharging said program counter and incrementer with the address of the subsequent information to be written.

7. A process for checking memories of a programmed computer, the memories being mapped into logic spaces suitable for containing information related to programs and data, the computer including a control memory suitable for storing a program constituted by instructions, a pre-processor suitable for decoding the instructions, two scanning cell chains being triggered by means of pre-established operating signals and providing control signals of said logic spaces of said memories and of said programs, a decoding unit transforming said instructions into operational signals, and a program counter and incrementer capable of controlling addressing the information contained in said memories, the process comprising:

selecting through said scanning cell chains, one of said memories to be checked and a logic space of said selected memory to be checked;

triggering said scanning cell chains using pre-established-operating signals to generate control signals indicative of said selected logic space according to a pre-selected checking procedure that is executed using instructions of said program stored in said control memory;

initializing, through said scanning cell chains, said program counter, to define the starting point of said selected memory to be checked;

triggering the addressing of said instructions of the program related to said pre-selected checking procedure, in order that it be executed by means of a pre-established number of clock strokes;

sending to a selected register information taken from said selected memory; and repeating in a loop, according to an incremental sequence, the executing of said instructions of the program so as to send in succession to said selected register all the information contained in the selected memory.

8. The process according to claim 7 wherein said pre-selected checking procedure includes:

executing a procedure for reading said selected memory.

9. The process according to claim 8 wherein executing the procedure for reading includes:

starting the procedure for reading;

preparing for addressing information to be read from a buffer register of the memory; and writing information read from the memory to the register and recharging said program counter and incrementer with an address of the information to be read.

10. The process according to claim 7 wherein said pre-selected checking procedure within said step of triggering said scanning cells includes:

executing a process of writing of pre-established information to said selected memory.

11. The process according to claim 10 wherein said step of executing the process of writing, includes:

starting writing information identical with a low-order part of an address;

preparing for addressing information to be written to a buffer register of the selected memory; and recharging said program counter and incrementer with the address of information to be written.

12. The process according to claim 10 wherein said step of executing the process of writing includes:

starting writing information from a first of two pre-selected registers;

recharging said program counter and incrementer with an address of the information to be written from the first pre-selected register;

starting writing information from a second of the two pre-selected registers; and recharging said program counter and incrementer with the address of the information to be written from the second pre-selected register.

13. The process according to claim 7 wherein the computer includes an output port and the process further includes sending to the output port the information read from the selected memory.

14. The process according to claim 7 wherein the computer includes a group of input and output ports and a file of registers and the process further includes selecting through the scanning cell chains a register of the file and a port of the group, and sending to the register and port selected the information taken from the selected memory.

15. A computer system for checking memory of a programmed computer, comprising:

a plurality of memories divided into logic spaces suitable for containing information related to programs and data;

a register connected to the memories; and a central processing unit, the central processing unit including:

a control memory storing a memory checking program constituted by instructions;

a pointer in communication with the control memory and capable of addressing said instructions;

a pre-processor in communication with the pointer and suitable for decoding the instructions;

two scanning cell chains in communication with the control memory, coupled to the plurality of memories via a bus, and suitable for being triggered by means of pre-established operating signals and including means for providing control signals indicative of said logic spaces of the memories and selecting one of the memories to be checked according to said instructions of said memory checking program;

a decoding unit in communication with the scanning cell chains and suitable for transforming said instructions into operational signals; and a program counter and incrementer in communication with one of the scanning cell chains and capable of controlling addressing the information contained in the selected memory.

16. The system according to claim 15 wherein the selected memory includes a read-and-write memory.

17. The system according to claim 15 wherein the memory checking program includes a program for reading the selected memory.

18. The system according to claim 15 wherein the memory checking program includes a program for writing to the selected memory from the register.

19. The system according to claim 15 further comprising an output port connected to the central processing unit, the port receiving information read from the selected memory via the central processing unit.

20. The system according to claim 15 wherein the register is one of a plurality of registers in a register file, the system further including an addressing circuit for providing an address of each register of the register file.

21. A process for checking memories of a programmed computer, comprising:

selecting through scanning cell chains, one of said memories to be checked and a logic space of said selected memory to be checked;

triggering said scanning cell chains using pre-established operating signals to generate control signals indicative of said selected logic space according to a pre-selected checking procedure that is executed using instructions of a memory checking program stored in a control memory of the programmed computer;

initializing, through said scanning cell chains, a program counter of the programmed computer, to define the starting point of said selected memory to be checked;

triggering an addressing of said instructions of the memory checking program related to said pre-selected checking procedure;

sending to a selected register of the programmed computer information taken from said selected memory; and repeating in a loop, according to an incremental sequence, the executing of said instructions of the memory checking program so as to send in succession to said selected register all the information contained in the selected memory.

22. The process according to claim 21 wherein said pre-selected checking procedure includes:

executing a procedure for reading said selected memory.

23. The process according to claim 22 wherein executing the procedure for reading includes:

starting the procedure for reading;

preparing for addressing information to be read from a buffer register of the memory; and writing information read from the selected memory to the selected register and recharging said program counter and incrementer with an address of the information to be read.

24. The process according to claim 21 wherein said pre-selected checking procedure within said step of triggering said scanning cells includes:

executing a process of writing of pre-established information to said selected memory.

25. The process according to claim 24 wherein said step of executing the process of writing, includes:

starting writing information identical with a low-order part of an address;

preparing for addressing information to be written to a buffer register of the selected memory; and recharging said program counter with the address of information to be written.

26. The process according to claim 24 wherein said step of executing the process of writing includes:

starting writing information from a first of two pre-selected registers;

recharging said program counter with an address of the information to be written from the first pre-selected register;

starting writing information from a second of the two pre-selected registers; and recharging said program counter and incrementer with the address of the information to be written from the second register.

27. The process according to claim 21 wherein the programmed computer includes an output port and the process further includes sending to the output port the information read from the selected memory.

28. The process according to claim 21 wherein the programmed computer includes a group of input and output ports and a file of registers and the process further includes selecting through the scanning cell chains a port of the group, and sending to the port selected the information taken from the selected memory.

* * * * *